(12) United States Patent
Seol

(10) Patent No.: US 6,243,314 B1
(45) Date of Patent: Jun. 5, 2001

(54) APPARATUS FOR SENSING A CURRENT DIRECTION OF AN INPUT SIGNAL AND AMPLIFYING THE SENSED INPUT SIGNAL IN SEMICONDUCTOR MEMORY DEVICE

(75) Inventor: Wook Seol, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/428,655

(22) Filed: Oct. 28, 1999

(30) Foreign Application Priority Data

Oct. 28, 1998 (KR) ........................................ 45281

(51) Int. Cl.[7] ................................................ G11C 7/02
(52) U.S. Cl. ............... 365/208; 365/189.11; 365/185.21; 365/207; 365/189.05
(58) Field of Search ............................... 365/208, 189.11, 365/185.21, 207, 189.05

(56) References Cited

U.S. PATENT DOCUMENTS

| | | |
|---|---|---|
| 4,140,958 | 2/1979 | Groeschel . |
| 4,984,204 * | 1/1991 | Sato et al. ........................ 365/189.11 |
| 5,706,236 * | 1/1998 | Yamamoto ............................ 365/205 |
| 5,789,948 * | 8/1998 | Kim et al. ............................... 327/55 |
| 5,838,515 | 11/1998 | Mortazavi et al. . |
| 5,844,427 | 12/1998 | Theus et al. . |
| 6,099,032 * | 12/1999 | Lin et al. ............................. 365/208 |

* cited by examiner

*Primary Examiner*—David Nelms
*Assistant Examiner*—Connie C . Yoka
(74) *Attorney, Agent, or Firm*—Jacobson, Price, Holman & Stern, PLLC

(57) ABSTRACT

An apparatus for sensing a current direction of an input signal and amplifying the sensed input signal to a logic level in use for semiconductor memory devices includes a current-direction sensing ad amplifying means for sensing a current direction of the input signal and amplifying the input signal in response to a sensing control signal to output a sensed and amplified signal, and a voltage level shift means for receiving a reference voltage from an external circuit and shifting a voltage level of the sensed and amplified signal to output a level shifted signal, thereby preventing an erroneous operation therein and improving a data access time.

5 Claims, 4 Drawing Sheets

APPARATUS FOR SENSING A CURRENT DIRECTION OF AN INPUT SIGNAL AND AMPLIFYING THE SENSED INPUT SIGNAL IN SEMICONDUCTOR MEMORY DEVICE

FIELD OF THE INVENTION

The present invention relates to a semiconductor device; and, more particularly, to an apparatus for sensing a current direction of an input signal and amplifying the sensed input signal to a logic level in use for semiconductor memory devices, in which an erroneous operation can be prevented and a data access time therein is improved.

DESCRIPTION OF THE PRIOR ART

As is well known to those skilled in the art, a sense amplifier serves as an amplifying device with a high gain and a wide band, which is use to amplify signals read out from memory cells to output the amplified signals as a logic level. The typical sense amplifiers sense a voltage level of an input signal and amplify the sensed input signal to output the amplified signal as a logic level.

FIG. 1 is a schematic diagram illustrating a SRAM (static random access memory) having a conventional sense amplifier.

Referring to FIG. 1, a memory cell 100 stores data. A bit line pair transfer the data stored in the memory call 100. The bit line pair include a bit line BL0 and a complementary bit line/BL0, wherein the bit line pair are respectively held at different voltage level. For example, when the bit line BL0 is held at a high level, the complimentary bit line/BL0 is held at a low level. A first switching transfer MS1, connected between the bit line BL0 and the memory cell 100, is switched in response to a write word line signal WWL which is activated by a write address. A second switching transistor MS2, connected between the memory cell 100 and the complementary bit line/BL0, is switched in response to the write word signal WWL. A third switching transistor MS3, one of whose terminals is connected to a read bit line RBL0, is switched in response to a read word line signal RWL which is activated by a read address. A fourth switching transistor MS4 receives the stored data from the memory cell 100, one of whose terminals is connected to the other terminal of the third switching transistor MS3 and the other terminal is connected to a ground voltage level. A first PMOS transistor MP1 supplies a precharge voltage, i.e., a power supply voltage level, to the read bit line RBL0 in response to a precharge signal PS. A fifth switching transistor MS5 is switched in response to a column select signal CS to transfer a read data, wherein the read data is a signal transferred from the memory cell 100 to the read bit line RBL0 through the third and fourth switching transistors MS3 and MS4. A sense amplifier 120, connected to the fifth switching transistor MS5, senses and amplifies the read data to output the amplified read data. A second PMOS transistor MP2, connected between the power supply voltage level VDD and an input terminal of the sense amplifier 120, charges the input terminal of the sense amplifier 120 to the power supply voltage in response to the amplified read data.

A read/write operation of the SRAM having the sense amplifier will be described with conjunction to FIG. 1.

At write operation, the first and second switching transistors MS1 and MS2 are turned on in response to the write word line address WWL, wherein the write word line signal WWL is enabled in response to the write address signal. Then, data on the bit line BL0 and the complementary bit line/BL0 are stored to the memory cell 100 through the turned-on first and second switching transistors MS1 and MS2. At this time, the memory cell 100 is implemented with a form of inverter latch, so that the stored data can be continuously retained in the memory cell 100 until the power supply voltage is removed.

On the other hand, at read operation, the third switching transistor MS3 is turned on in response to the read word line signal RWL, wherein the read word line signal RWL is enabled by a read address signal. At this time, if the data stored in the memory cell 100 is "high", the fourth switching transistor MS4 is turned on, so that a voltage level on the read bit line RBL0 is pulled down from the precharge potential (power supply voltage level) to a "low" level. If the data stored in the memory cell 100 is "low", the fourth switching transistor MS4 is turned off, so that the read bit line RBL0 keeps the precharge potential. Then, the voltage level on the read bit line RBL0 is transferred to the sense amplifier 120 through the fifth switching transistor MS5. The sense amplifier 120 then amplifies the transferred voltage level to output the amplified voltage of a logic level as the read data.

As a capacity of the SRAM becomes increasing through sophisticated technology, the number of memory cells connected to the read bit line is also increased, resulting in an increase of an undesirable parasitic capacitance on the read bit line. The increase of the undesirable parasitic capacitance may delay a period of pulling up the read data to the full logic level at the read bit line. Accordingly, the sense amplifier is slow to output the read data, thereby increasing a data access time of the memory device.

SUMMARY OF THE INVENTION

It is, therefore an object of the present invention to provide an apparatus for sensing a current direction of an input signal and amplifying the sensed input signal to a logic level in use for semiconductor memory devices, in which an erroneous operation can be prevented and a data access time therein can be greatly improved.

It is, therefore, another object of the present invention to provide an apparatus for sensing a current direction of an input signal and amplifying the sensed input signal to a logic level in use for semiconductor memory devices, comprising; a current-direction sensing and amplifying means for a sensing a current direction of the input signal and amplifying the input signal in response to a sensing control signal to output a sensed and amplified signal; and a voltage level shift means for receiving a reference voltage from an external circuit and shifting a voltage level of the sensed and amplified signal to output a level shifted signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
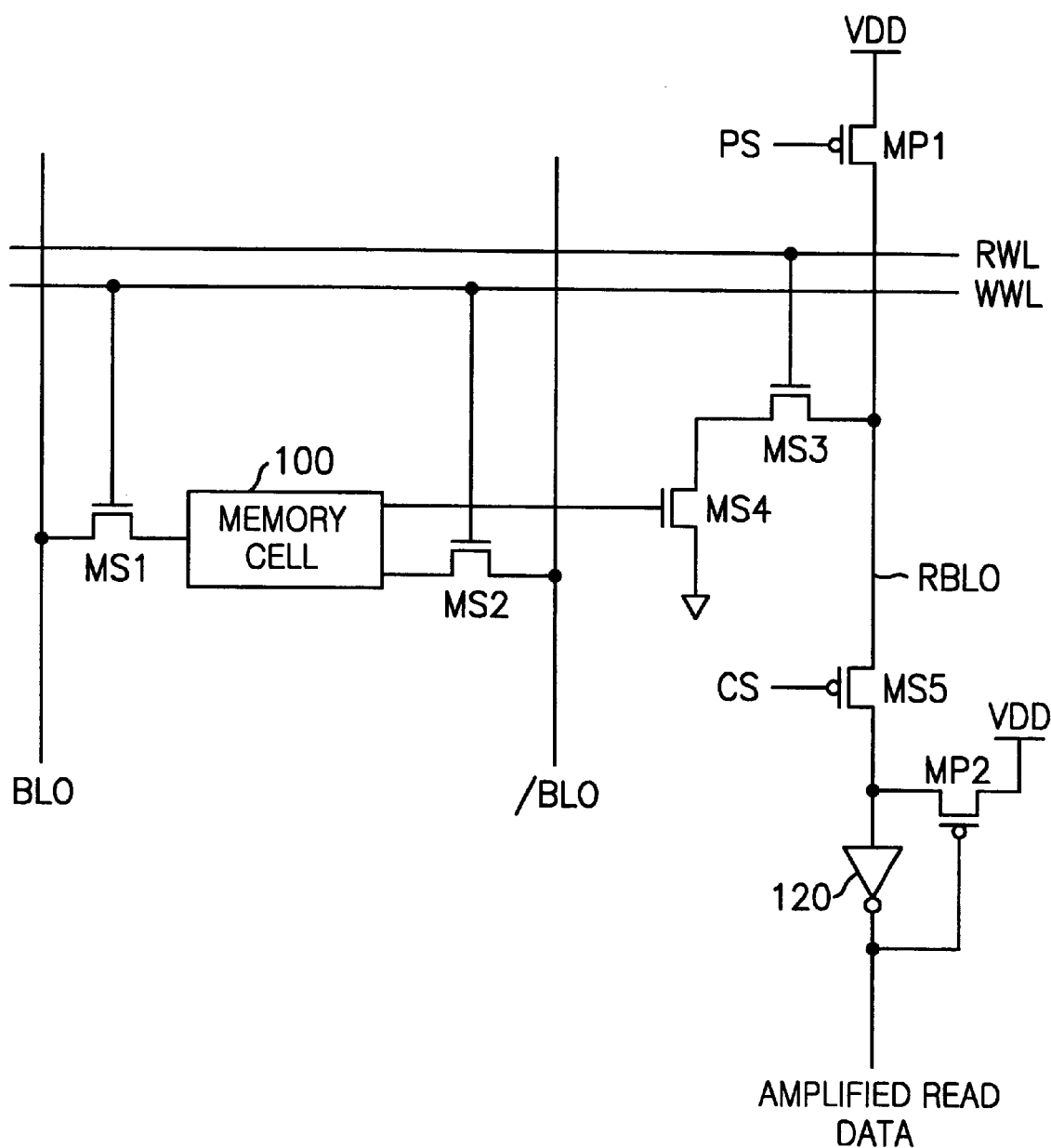
FIG. 1 is a schematic diagram illustrating SRAM having a conventional sense amplifier.
Figure 2:
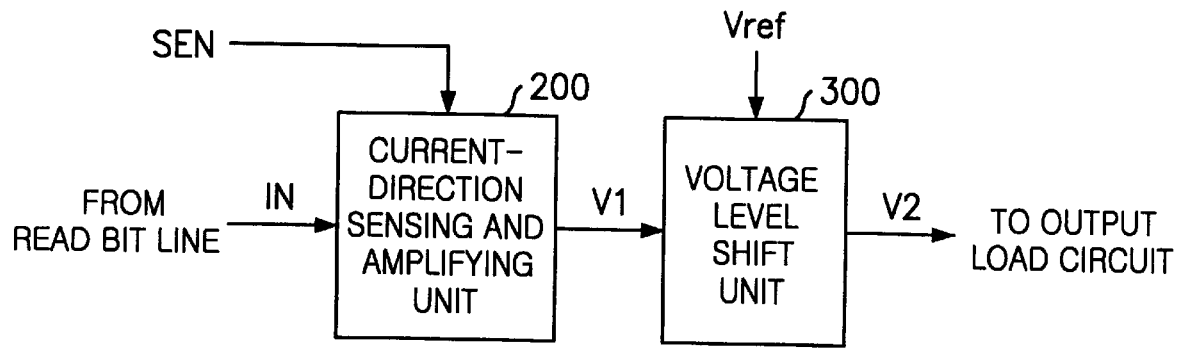
FIG. 2 is a block diagram illustrating a current-direction sense amplifier in accordance with the present invention.

FIG. 2 is a block diagram illustrating a current-direction sense amplifier according to the present invention. Referring to FIG. 2, a current-direction sensing and amplifying unit 200 senses a current direction of the input signal IN from a read bit line and amplifies the input signal IN in response to a sensing control signal SEN to output a sensed and amplified signal V1. A voltage level shift unit 300 receives a reference voltage $V_{ref}$ from an external circuit and shifts a voltage level of the sensed and amplified signal V1 to output a level shifted signal V2.

Since the sensed and amplified signal V1 does not reach a full swing level, a static current may occur in an output load circuit. The voltage level shift unit 300 shifts the voltage level of the sensed and amplified signal V1 to thereby output a level shifted signal V2 corresponding to a full swing level. Therefore, the static current can be effectively prevented.

Figure 3:
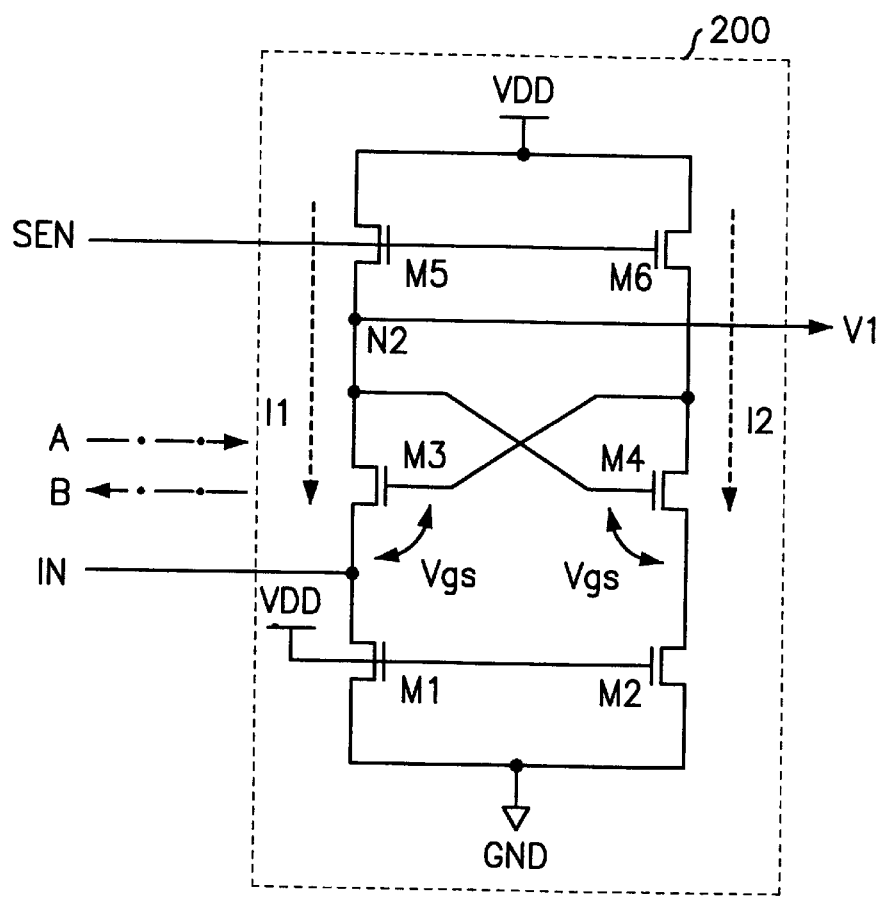
FIG. 3 is a circuit diagram illustrating a current-direction sensing and amplifying unit shown in FIG. 2.

FIG. 3 shows the current-direction sensing and amplifying unit shown in FIG. 2.

Referring to FIG. 3, a first NMOS transistor M1 has a source connected to a ground voltage level GND, a gate connected to a power supply voltage level VDD and a drain receiving the input signal IN. A second NMOS transistor Ms has a source connected to the ground voltage level GND, a gate connected to the power supply voltage level VDD. A third NMOS transistor M3 has a source connected to the drain of the first NMOS transistor M1. A fourth NMOS transistor M4 has a source connected to a drain of the second NMOS transistor M2, a gate connected to a drain of the third NMOS transistor M3 and a drain connected to a gate of the third NMOS transistor M3. A fifth NMOS transistor M5 has a source connected to the drain of the third NMOS transistor M3, a gate connected to the sensing control signal SEN and a drain connected to the power supply voltage level VDD, wherein the sensed and amplified signal V1 is outputted at an output node N1 between the fifth NMOS transistor M5 and the third NMOS transistor M3. A sixth NMOS transistor M6 has a source connected to the drain of the fourth NMOS transistor M4, a gate connected to the sensing control signal SEN and a drain connected to the power supply voltage level VDD.

At this time, the first and second NMOS transistors M1 and M2 operate at a linear region, the third and fourth NMOS transistors M3 and M4 operate in a saturation region and a linear region, and the fifth and sixth NMOS transistors M5 and M6 operate in a saturation region.

When the read bit line is "high", a current direction of the input signal IN is toward the current-direction sensing and amplifying unit 200 (in the direction of arrow "A"). Accordingly, the first NMOS transistor M1 keeps a drain voltage level higher than the ground voltage level GND, so that a gate-source voltage $V_{gs}$ of the third NMOS transistor M3 is reduced. As a result, a first current I1 flowing through the fifth and third NMOS transistors M5 and M3 is also reduced. Additionally, a voltage at the output node N1 is increased to compensate the reduced first current I1.

At this time, when the voltage at the output node N1 is increased, a voltage at a gate terminal of the fourth NMOS transistor M4 is also increased, so that a second current I2 flowing through the sixth and fourth NMOS transistors M6 and M4 is increased. Accordingly, a voltage level at a drain terminal of the fourth NMOS transistor M4 is lowered to compensate the increased second current I2. At this time, since the third and fourth NMOS transistors M3 and M4 is in a linear region, even slight voltage change can cause the current to change very large. Therefore, voltage changes at the output node N1 and a node N2 accelerate the current changes, thereby completing very fast the amplification of the input signal IN. That is, when a voltage at the output node N1 is increased, the gate-source voltage $V_{gs}$ of the fourth NMOS transistor M4 is increased more, so that the second current I2 flows much more. Accordingly, the voltage at the output node N1 is lowered more, so that the gate-source voltage $V_{gs}$ of the third NMOS transistor M3 is lowered much more. Therefore, the first current I1 is decreased, resulting in increase of the voltage at the output node N1.

Consequently, even when the input signal IN changes slightly, the voltage at the output node N1 changes very large.

One the other hand, when the read bit line is "low", a current direction of the input signal IN is outward the current-direction sensing and amplifying unit 200 (in the direction of arrow "B"). Accordingly, the first NMOS transistor M1 keeps a drain voltage level lower than the ground voltage level GND, so that a gate-source voltage $V_{gs}$ of the third NMOS transistor M3 is increased. As a result, a first current I1 flowing through the fifth and third NMOS transistors M5 and M3 is also increased. Additionally, a voltage at the output node N1 becomes decreased.

At this time, when the voltage at the output node N1 is reduced, a voltage at a gate terminal of the fourth NMOS transistor M4 is also reduced, so that a second current I2 flowing through the sixth and fourth NMOS transistors M6 and M4 is decreased. Accordingly, a voltage level at a drain terminal of the fourth NMOS transistor M4 is increased. That is, when a voltage at the output node N1 is decreased, the gate-source voltage $V_{gs}$ of the fourth NMOS transistor M4 is decreased more, so that the second current I2 is decreased much more. Accordingly, the voltage at the output node N1 is increased more, so that the gate-source voltage $V_{gs}$ of the third NMOS transistor M3 is increased much more. Therefore, the first current I1 is increased, resulting in decrease of the voltage at the output node N1.

Figure 4:
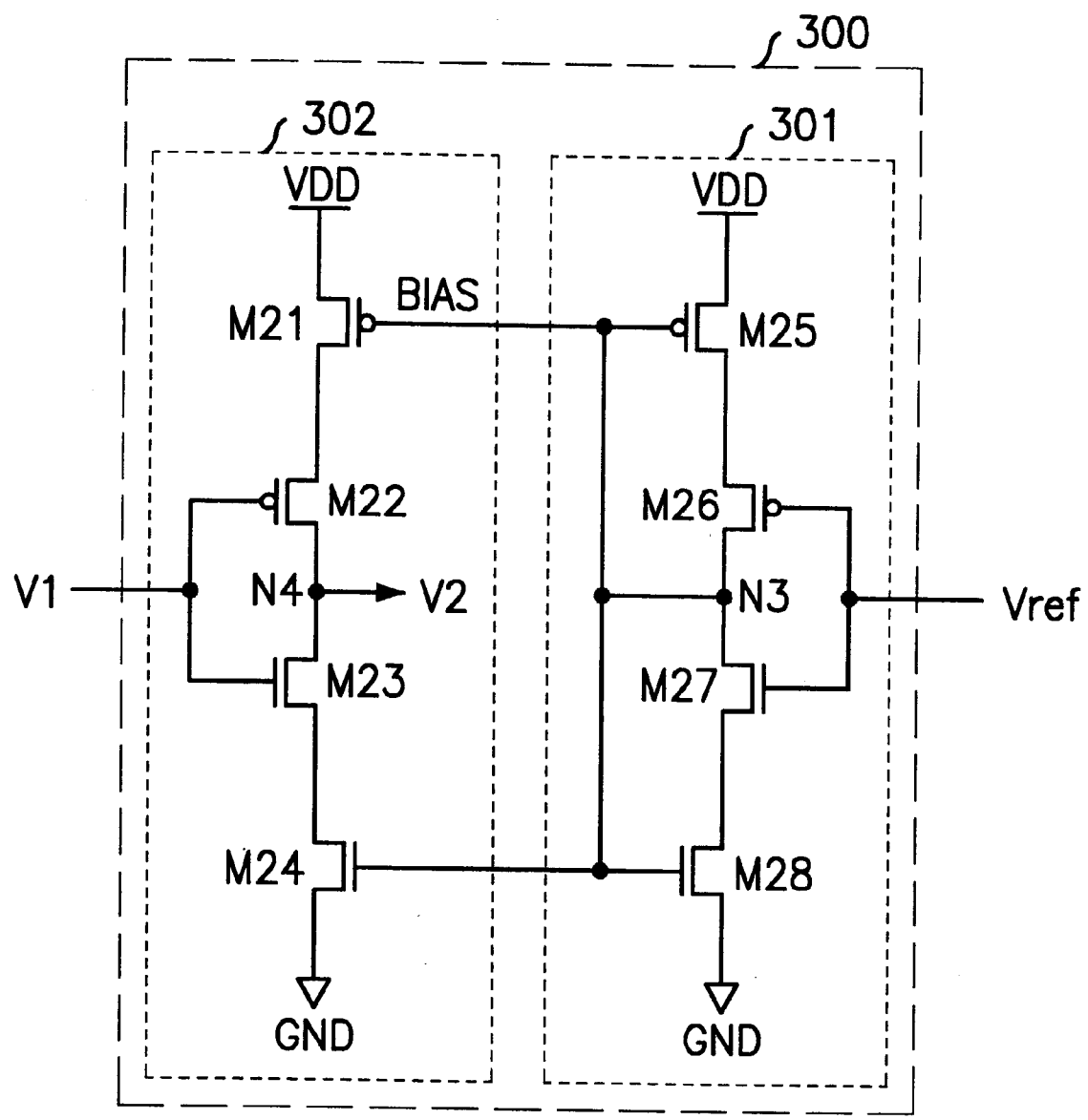
FIG. 4 is a circuit diagram illustrating a voltage level shift unit shown in FIG. 2.

FIG. 4 is a circuit diagram illustrating the voltage level shift unit shown in FIG. 2 according to an embodiment of the present invention.

Referring to FIG. 4, a bias voltage supplying unit 301 supplies a bias voltage BIAS in response to a reference voltage $V_{ref}$ inputted from an external circuit. A level shifting unit 302 shifts the voltage level of the sensed and amplified signal V1 in response to the bias voltage BIAS to output the voltage shifted signal V2.

The bias voltage supplying unit 301 includes a first PMOS transistor M25 having a source connected to the power supply voltage VDD and a gate receiving a bias voltage BIAS, a second PMOS transistor M26 having a source connected to a drain of the first PMOS transistor M25 and a gate receiving the reference voltage $V_{ref}$, a first NMOS transistor M27 having a drain connected to a drain of the second PMOS transistor M26 and a gate receiving the reference voltage $V_{ref}$, a second NMOS transistor M28 connected between the first NMOS transistor M27 and the ground voltage level GND, whose gate terminal receives the bias voltage BIAS. The bias voltage BIAS is outputted from a third common node N3 between the second PMOS transistor M26 and the first NMOS transistor M27. At this time, the reference voltage $V_{ref}$ is applied from a typical reference voltage generator, thereby keeping a constant level without an influence of voltage, temperature, processors and so on.

The level shifting unit 302 includes a third PMOS transistor M21 having a source connected to the power supply voltage VDD and a gate receiving the bias voltage BIAS, a fourth PMOS transistor M22 having a source connected to a drain of the third PMOS transistor M21 and a gate receiving the sensed and amplified signal V1, a third NMOS transistor M23 having a drain connected to the drain of the fourth PMOS transistor M22 and a gate receiving the sensed and amplified signal V1, a fourth NMOS transistor M24 connected between the third NMOS transistor M23 and the ground voltage level GND, whose gate receives the bias voltage BIAS. The output of the level shifting unit 302, i.e., the level shifted signal V2 is outputted from a common node N4 between the fourth PMOS transistor M22 and the third NMOS transistor M23.

FIG, 5 is a simulated waveform of the sensed and amplified signal and the level shifted signal. It can be seen that the level shifted voltage V2 reaches a full swing level with respect to the sensed and amplified signal V1.

Figure 5:
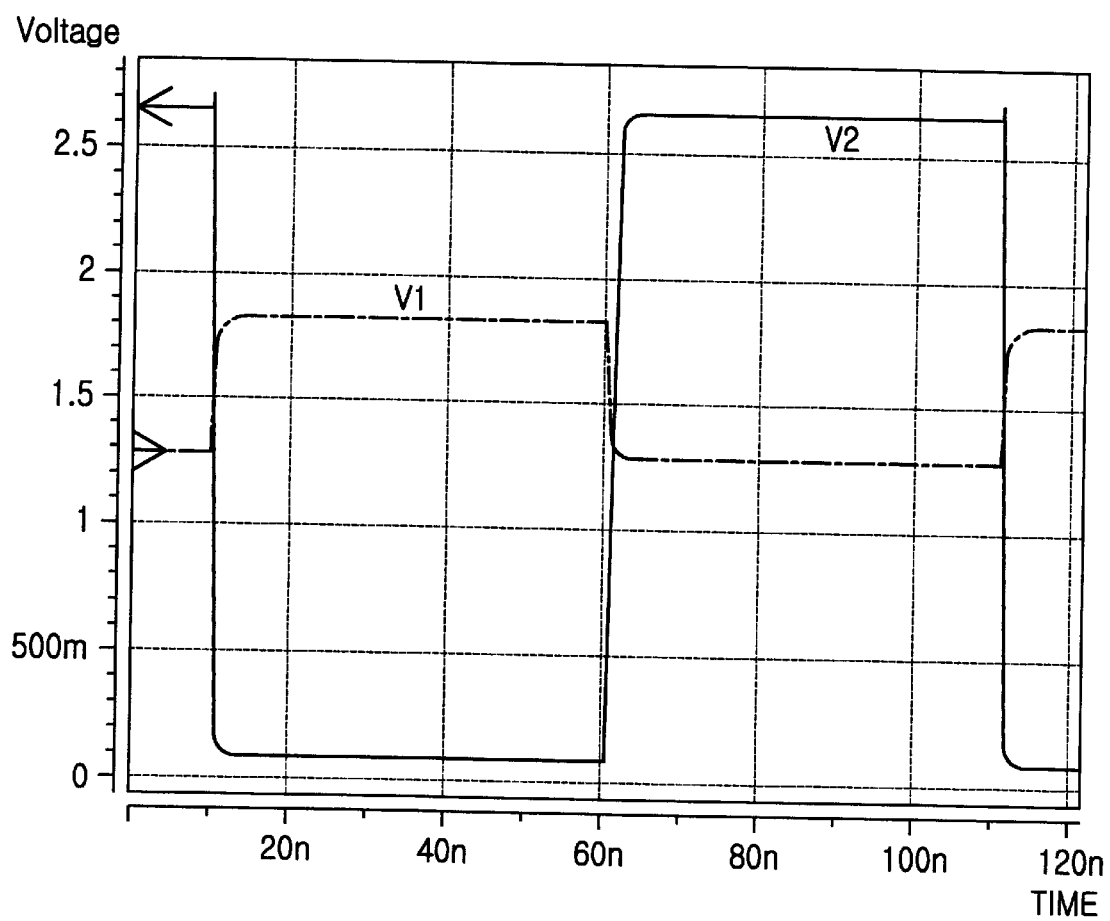
FIG. 5 is a simulated waveform of a voltage level shift unit shown in FIG. 2.

An operation of the level shifting unit 302 will be described with reference to FIGS. 4 and 5.

The fourth PMOS transistor M22 and the third NMOS transistor M23 operate as an inverter to shift the sensed and amplified signal V1. The bias voltage BIAS is applied to the gates of the third PMOS transistor M21 and the fourth NMOS transistor M24, wherein each transistor serves as a bias transistor. At this time, the bias voltage BIAS is very stable due to a negative feedback, so it can be kept in a constant logic threshold voltage. That is, while a typical logic threshold voltage is determined by a size of a transistor receiving an input signal, the logic threshold voltage according to the present invention is determined by the bias supplying unit 301. Therefore, the level of the sensed and amplified signal V1 can be shifted to a full swing level without an influence of the power supply voltage.

As a result, the current-direction sense amplifier according to the present invention performs the amplification operation by sensing the current direction, not the voltage level. Then, the amplified voltage level is shifted to the full swing level. Therefore, there is not the influence of the parasitic capacitance as well as the power supply voltage, preventing an error operation. Further, due to the swift amplification, the data access time can be greatly improved.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. An apparatus for sensing a current direction of an input signal and amplifying the sensed input signal to a logic level in use for semiconductor memory devices, comprising:

a current-direction sensing and amplifying means for sensing a current direction of the input signal and amplifying the input signal in response to a sensing control signal to output a sensed and amplified signal; and a voltage level shift means for receiving a reference voltage from an external circuit and shifting a voltage level of the sensed and amplified signal to output a level sifted signal, wherein the voltage level shift means includes:

a supplying means for supplying a bias voltage in response to a reference voltage inputted from an external circuit; and a level shifting means for shifting the voltage level of the sensed and amplified signal in response to the bias voltage to output the level shifted signal.

2. The apparatus as recited in claim 1, wherein the current-direction sensing and amplifying means includes:

a first NMOS transistor having a source connected to a ground voltage level, a gate connected to a power supply voltage level and a drain receiving the input signal;

a second NMOS transistor having a source connected to the ground voltage level, a gate connected to the power supply voltage level;

a third NMOS transistor having a source connected to the drain of the first NMOS transistor;

a fourth NMOS transistor having a source connected to a drain of the second NMOS transistor, a gate connected to a drain of the third NMOS transistor and a drain connected to a gate of the third NMOS transistor;

a fifth NMOS transistor having a source connected to the drain of the third NMOS transistor, a gate receiving the sensing control signal and a drain connected to the power supply voltage level, wherein the sensed and amplified signal is outputted through the source of the fifth NMOS transistor; and a sixth NMOS transistor having a source connected to the drain of the fourth NMOS transistor, a gate receiving the sensing control signal and a drain connected to the power supply voltage level.

3. The apparatus as recited in claim 1, wherein the supplying means includes:

a first PMOS transistor having a source connected to the power supply voltage and a gate receiving the bias voltage;

a second PMOS transistor having a source connected to a drain of the first PMOS transistor and a gate receiving the reference voltage, wherein the bias voltage is outputted from the drain of the second PMOS transistor;

a first NMOS transistor having a drain connected to the drain of the second PMOS transistor and a gate receiving the reference voltage; and a second NMOS transistor connected between the first NMOS transistor and the ground voltage level, whose gate receives the bias voltage.

4. The apparatus as recited in claim 3, wherein the reference voltage keeps a constant level.

5. The apparatus as recited in claim 1, wherein the level shifting means includes:

a first PMOS transistor having a source connected to the power supply voltage and a gate receiving the bias voltage;

a second PMOS transistor having a source connected to a drain of the first PMOS transistor and a gate receiving the sensed and amplified signal;

a first NMOS transistor having a drain connected to the drain of the second PMOS transistor and a gate receiving the sensed and amplified signal, wherein the drain of the first NMOS transistor outputs the level shifted signal; and a second NMOS transistor connected between the first NMOS transistor and the ground voltage level, whose gate terminal receives the bias voltage.

* * * * *